United States Patent [19]
Yamashita

[11] Patent Number: 5,973,519
[45] Date of Patent: Oct. 26, 1999

[54] VOLTAGE CONTROLLED OSCILLATOR CIRCUIT CAPABLE OF SWITCHING BETWEEN OSCILLATION FREQUENCY BANDS

[75] Inventor: Osamu Yamashita, Tokyo, Japan

[73] Assignee: NEC Corporation, Tokyo, Japan

[21] Appl. No.: 09/006,221

[22] Filed: Jan. 13, 1998

[30] Foreign Application Priority Data

Jan. 20, 1997 [JP] Japan ..................... 9-007120

[51] Int. Cl.⁶ ............................. H03C 3/00
[52] U.S. Cl. ........................... 327/101; 331/177 V
[58] Field of Search ............ 327/101; 331/177 V, 331/36 C, 117 R, 117 FE

[56] References Cited

U.S. PATENT DOCUMENTS

| | | | |
|---|---|---|---|
| 4,216,451 | 8/1980 | Nishimura et al. | 334/15 |
| 4,518,930 | 5/1985 | Rozema et al. | 331/36 C |
| 4,801,898 | 1/1989 | Obayashi | 331/132 |
| 5,101,177 | 3/1992 | Norimatsu | 331/117 R |
| 5,748,051 | 5/1998 | Lewis | 331/117 R |
| 5,856,763 | 1/1999 | Reeser et al. | 331/49 |

FOREIGN PATENT DOCUMENTS

| | | |
|---|---|---|
| 5-063438 | 3/1993 | Japan . |
| 7-231219 | 8/1995 | Japan . |
| 2 196 197 | 4/1988 | United Kingdom . |
| 2 215 929 | 9/1989 | United Kingdom . |

*Primary Examiner*—Kenneth B. Wells
*Assistant Examiner*—Hai L. Nguyen
*Attorney, Agent, or Firm*—Young & Thompson

[57] ABSTRACT

A voltage controlled oscillator circuit having a negative resistance section for supplying electric power to the voltage controlled oscillator circuit and a parallel resonance circuit includes a first variable capacitance diode and a second variable capacitance diode which are connected in parallel. The first variable capacitance diode varies its capacitance according to a first control voltage and thereby varies oscillation frequency of the voltage controlled oscillator circuit. The second variable capacitance diode varies its capacitance according to a second control voltage which is independent of the first control voltage, and thereby varies the oscillation frequency of the voltage controlled oscillator circuit independently. Coupling condensers are provided between the negative resistance section and the first variable capacitance diode, and between the first variable capacitance diode and the second variable capacitance diode to cut off direct current.

2 Claims, 3 Drawing Sheets

VOLTAGE CONTROLLED OSCILLATOR CIRCUIT CAPABLE OF SWITCHING BETWEEN OSCILLATION FREQUENCY BANDS

BACKGROUND OF THE INVENTION

The present invention relates to a voltage controlled oscillator circuit, and in particular, to a voltage controlled oscillator circuit by which a variable range of the oscillation frequency of the voltage controlled oscillator circuit can be enlarged and in which digitally switching of the oscillation frequency of the voltage controlled oscillator circuit from one oscillation frequency band to another is made possible.

DESCRIPTION OF THE RELATED ART

FIG. 1 is a circuit diagram showing a conventional voltage controlled oscillator circuit. The basic oscillation section of the voltage controlled oscillator circuit of FIG. 1 is composed of a Colpitts type oscillation circuit, in which a variable capacitance diode $D_1$ is provided in order to vary the oscillation frequency of the voltage controlled oscillator circuit. An oscillation frequency control voltage $E_c$ for controlling the oscillation frequency of the voltage controlled oscillator circuit is applied between a pair of terminals on the left-hand side of the circuit. When the oscillation frequency control voltage $E_c$ is increased, the capacitance $Cv_1$ of the variable capacitance diode $D_1$ comprising the parallel resonance circuit decreases, and thus the oscillation frequency of the voltage controlled oscillator circuit increases.

There are proposed some kinds of voltage controlled oscillator circuits in order to provide a wider variable range of the oscillation frequency which varies according to the control voltage.

FIG. 2 is a circuit diagram showing another conventional voltage controlled oscillator circuit which is disclosed in Japanese Patent Application Laid-Open No. HEI7-231219. In the circuit of FIG. 2, the basic oscillation section of the circuit is composed of a Colpitts type oscillation circuit in the same way as the circuit of FIG. 1, and an inductor $L_1$ is provided in series with the variable capacitance diode $D_1$. Further, the inductance $L_1$ of the inductor $L_1$ is selected so that the reactance (i.e. imaginary part of the impedance) of the series resonance circuit composed of the inductor $L_1$ and the variable capacitance diode $D_1$ will be capacitive (i.e. negative) all over the variable range of the oscillation frequency of the voltage controlled oscillator circuit.

In the voltage controlled oscillator circuit, the oscillation frequency is controlled by varying capacitance $Cv_1$ of the variable capacitance diode $D_1$ by varying the oscillation frequency control voltage $E_c$. Further, the variable range of the capacitance $Cv_1$ of the variable capacitance diode $D_1$ with respect to a certain variable range of the oscillation frequency control voltage $E_c$ is made larger than the case where the inductor $L_1$ is not connected in series with the variable capacitance diode $D_1$ (i.e. than the case of FIG. 1). Therefore, a wider variable range of the oscillation frequency is made possible in the voltage controlled oscillator circuit of FIG. 1, by connecting the variable capacitance diode $D_1$ and the inductor $L_1$ together in series.

In the conventional voltage controlled oscillator circuit of FIG. 2, the width of the variable range of the oscillation frequency controlled by the oscillation frequency control voltage $E_c$ is fully dependent on the width of variable range of the capacitance $Cv_1$ of one variable capacitance diode $D_1$. However, the variable range of capacitance of coupled semiconductor devices in a variable capacitance diode is limited, and thus further extension of the range is nearly impossible. Therefore, there is a limitation to the enlargement of the variable range of the oscillation frequency in the conventional voltage controlled oscillator circuit of FIG. 2.

Further, in the conventional voltage controlled oscillator circuit of FIG. 2, there is provided only one pair of terminals for inputting the oscillation frequency control voltage, and one oscillation frequency control signal supplied to the terminals is used. Therefore, it is impossible in the conventional circuit to switch the oscillation frequency digitally from one oscillation frequency band to another.

SUMMARY OF THE INVENTION

It is therefore the primary object of the present invention to provide a voltage controlled oscillator circuit in which the variable range of the oscillation frequency is further enlarged and digitally switching of the oscillation frequency between oscillation frequency bands is made possible.

In accordance with one aspect of the present invention, there is provided a voltage controlled oscillator circuit using a negative resistance section for supplying electric power to the voltage controlled oscillator circuit and parallel resonance of the capacitance and the inductance of the circuit. The voltage controlled oscillator circuit comprises a first variable capacitance diode and a second variable capacitance diode which is connected in parallel with the first variable capacitance diode. The first variable capacitance diode varies its capacitance according to a first control voltage and thereby varies the oscillation frequency of the voltage controlled oscillator circuit, and the second variable capacitance diode varies its capacitance according to a second control voltage which is independent of the first control voltage and thereby varies the oscillation frequency of the voltage controlled oscillator circuit independently.

Preferably, a first coupling condenser is provided between the negative resistance section and the first variable capacitance diode, and a second coupling condenser is provided between the first variable capacitance diode and the second variable capacitance diode.

Preferably, the first control voltage is applied to the first variable capacitance diode via a choking coil.

Preferably, an inductor is provided in series with the first variable capacitance diode.

Preferably, an inductor is provided in series with the second variable capacitance diode.

In accordance with another aspect of the present invention, there is provided a voltage controlled oscillator circuit whose oscillation frequency is decided according to the capacitance and the inductance of the circuit, comprising a capacitance section, a second variable capacitance diode, and a negative resistance section. The capacitance section is composed of a series connection of a first variable capacitance diode and an inductor, and varies its capacitance according to a first control voltage. The second variable capacitance diode is connected in parallel with the capacitance section, and varies its capacitance according to a second control voltage. And the negative resistance section is connected in parallel with the capacitance section, and supplies electric power to the voltage controlled oscillator circuit.

Preferably, a first coupling condenser is provided between the negative resistance section and the capacitance section, and a second coupling condenser is provided between the capacitance section and the second variable capacitance diode.

Preferably, the first control voltage is applied to the capacitance section via a choking coil.

In accordance with another aspect of the present invention, there is provided a voltage controlled oscillator circuit whose oscillation frequency is decided according to the capacitance and the inductance of the circuit, comprising a negative resistance section and a plurality of variable capacitance diodes. The negative resistance section supplies electric power to the voltage controlled oscillator circuit. The variable capacitance diodes are connected in parallel with the negative resistance section and in parallel with each other. The capacitance of each variable capacitance diode is controlled by a corresponding independent control voltage.

Preferably, coupling condensers are provided between the variable capacitance diodes, and between the negative resistance section and the adjacent variable capacitance diode.

Preferably, a control voltage is applied to corresponding one of the variable capacitance diodes via a choking coil.

Preferably, an inductor is provided in series with one of the variable capacitance diodes.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
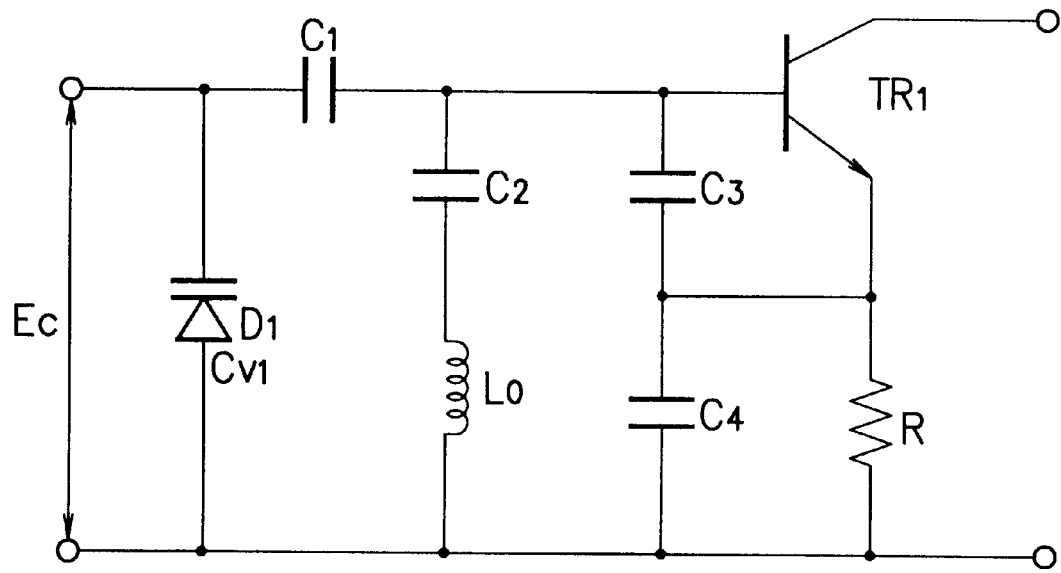
FIG. 1 is a circuit diagram showing a conventional voltage controlled oscillator circuit.

Referring now to the drawings, a description will be given in detail of preferred embodiments in accordance with the present invention.

Figure 3:
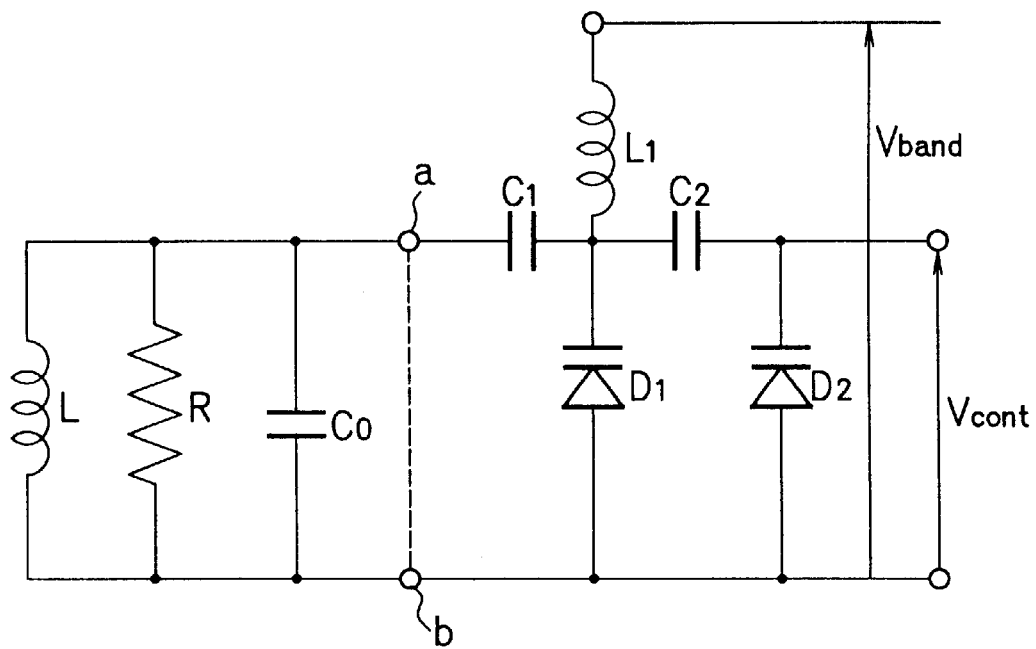
FIG. 3 is a circuit diagram showing a voltage controlled oscillator circuit according to an embodiment of the present invention.

FIG. 3 is a circuit diagram showing a voltage controlled oscillator circuit according to an embodiment of the present invention. In the following, an element of the circuit and a characteristic value of the element is represented by the same character. For example, capacitance of a capacitor $C_0$ is represented as $C_0$ and inductance of an inductor $L_0$ is represented as $L_0$.

The circuit of FIG. 3 comprises a variable capacitance diode $D_1$, a variable capacitance diode $D_2$, a capacitor $C_0$, a negative resistance section $-R$, an inductor $L$, which are connected in parallel. Here, the part on the left-hand side of the broken line a-b ($C_0$, $-R$, $L$) is a representation of a parallel resonance circuit without the variable capacitance diode $D_1$, and the variable capacitance diode $D_2$, which will be described below. Coupling condensers $C_1$ and $C_2$ for cutting direct current off is inserted between the variable capacitance diode $D_1$ and the left-hand side part, and between the variable capacitance diode $D_1$ and the variable capacitance diode $D_2$, respectively.

Here, the part on the left-hand side of the broken line a-b will be explained. Actually, the left-hand side part is composed of a parallel resonance circuit including active elements for generating electric power such as transistors, which is supplied with power source voltage. The left-hand side part may be composed of the circuit of FIG. 1 from which the variable capacitance diode $D_1$ and the coupling condenser $C_1$ in FIG. 1 are removed. Incidentally, FIG. 1 and FIG. 3 are opposite in right-left direction and when the right-hand side of FIG. 1 is used for this embodiment, the variable capacitance diode $D_1$ and the coupling condenser $C_1$ of FIG. 1 are replaced by the right-hand side of the broken line a-b of FIG. 3, that is, the right-hand side of the broken line a-b of FIG. 3 is used instead of the variable capacitance diode $D_1$ and the coupling condenser $C_1$ of FIG. 1. Of course, other parallel resonance circuits can be used as the left-hand side part of FIG. 3. Therefore in FIG. 3, the negative resistance section $-R$, the capacitor $C_0$ and the inductor $L$ are only representing the composite (synthesized) resistance, the composite capacitance and the composite inductance of the part on the left-hand side of the broken line a-b which has been described above. The negative resistance section $-R$ is different from general resistance in the sense that it is supplied with the power source voltage and generates electric power in the voltage controlled oscillator circuit.

Next, the part on the right-hand side of the broken line a-b of FIG. 3 will be explained. A DC voltage $V_{band}$ is applied to the variable capacitance diode $D_1$ via a choking coil $L_1$ by a voltage source such as a constant-voltage regulated power supply. The choking coil $L_1$ is connected in series with the variable capacitance diode $D_1$ in order to prevent application of high frequency voltage generated in the circuit of FIG. 3 to the voltage source. Another control voltage $V_{cont}$ is applied to the variable capacitance diode $D_2$ by a voltage source which is independent of the voltage source of the DC voltage $V_{band}$. Further, aforementioned coupling condenser $C_1$ is inserted between the variable capacitance diode $D_1$ and the point 'a' in FIG. 3 in order to prevent application of the DC voltage $V_{band}$ (for being applied to the variable capacitance diode $D_1$) to the left-hand side of the broken line a-b. Here, the tips of arrows shown in FIG. 3 represent high voltage sides of the control voltage $V_{cont}$ and the DC voltage $V_{band}$, that is, the variable capacitance diode $D_1$ and the variable capacitance diode $D_2$ are connected inversely to the voltages which are applied thereto.

Here, when the part on the right-hand side of the negative resistance section $-R$ is replaced with a capacitor $C'$ having a composite capacitance $C'$, in other words, when the circuit of FIG. 3 is regarded as a parallel resonance circuit composed of the inductor $L$, the negative resistance section $-R$ and the capacitor $C'$, the circuit of FIG. 3 can be regarded as an oscillation circuit whose oscillation frequency is controlled by the capacitance $C'$ of the capacitor $C'$ and the inductance $L$ of the inductor $L$.

In the following, the operation of the voltage controlled oscillator circuit of this embodiment will be described in detail referring to FIG. 3.

The oscillation frequency $f_0$ of the voltage controlled oscillator circuit is decided by the inductance $L$ of the inductor $L$ which is shown on the left-hand side of the broken line a-b, the composite capacitance $C'$ which is composed of the capacitance $C_0$ of the capacitor $C_0$, the capacitance $D_1$ of the variable capacitance diode $D_1$, and the capacitance $D_2$ of the variable capacitance diode $D_2$, as the following equation (1).

$$fo = \frac{1}{2\pi\sqrt{L \cdot C'}} \quad (1)$$

The oscillation frequency $f_0$ can be controlled by varying the composite capacitance C'. The composite capacitance C' is approximately given by the sum of capacitance of capacitors connected in parallel, that is, $C_0+D_1+D_2$, and the composite capacitance C' can be varied by varying the capacitance $D_1$ of the variable capacitance diode $D_1$ by varying the DC voltage $V_{band}$, and by varying the capacitance $D_2$ of the variable capacitance diode $D_2$ by varying the control voltage $V_{cont}$ which is independent of the DC voltage $V_{band}$. Incidentally, in order to vary the composite capacitance C' widely by the control voltage $V_{cont}$ and the DC voltage $V_{band}$, it is preferable that the value $C_0$ is small, and $D_1$ and $D_2$ are dominant in the composite capacitance C'. As above, the oscillation frequency $f_0$ of the voltage controlled oscillator circuit can be controlled by two independent control voltages $V_{cont}$ and $V_{band}$, thereby the variable range of the oscillation frequency is enlarged and digitally switching the oscillation frequency between oscillation frequency bands is made possible.

Figure 2:
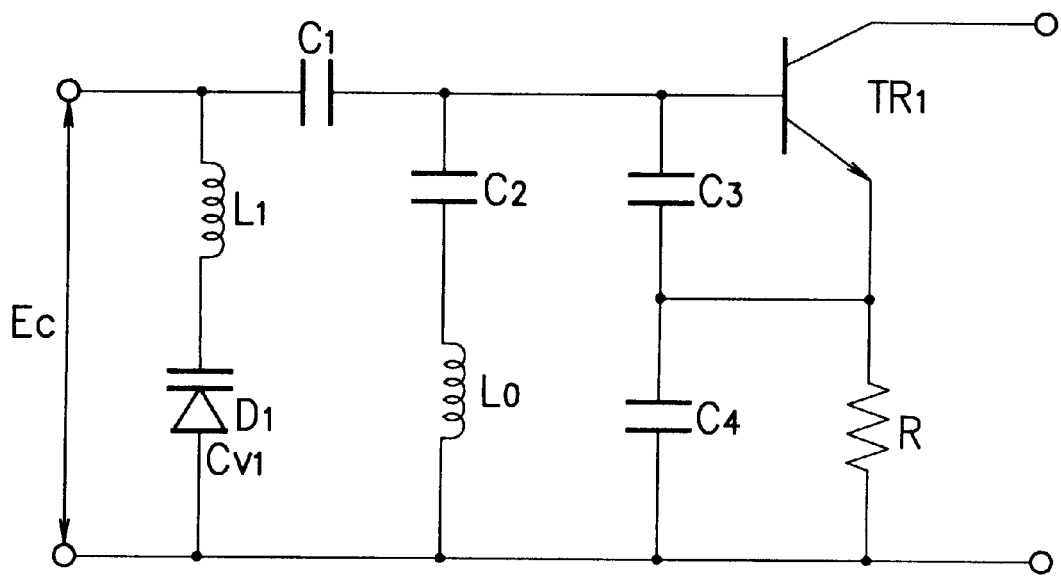
FIG. 2 is a circuit diagram showing another conventional voltage controlled oscillator circuit which is disclosed in Japanese Patent Application Laid-Open No. HEI7-231219.

Concretely, when switching of the oscillation frequency $f_0$ between oscillation frequency bands is unnecessary, the oscillation frequency $f_0$ of the voltage controlled oscillator circuit is controlled by varying the control voltage $V_{cont}$ only, similarly to the operations of the conventional voltage controlled oscillator circuits of FIG. 1 and FIG. 2. Here, the variable range of the capacitance $D_2$ of the variable capacitance diode $D_2$ is limited, and thus the band to band switching (for example, 900MHz band to 1.8GHz band) of the oscillation frequency $f_0$ is impossible by varying the control voltage $V_{cont}$ only. In order to execute the band to band switching, the DC voltage $V_{band}$ is applied to the capacitance $D_1$ (or varied). By the operation, the capacitance $D_1$ of the variable capacitance diode $D_1$ varies, thereby the composite capacitance C' is varied and thus the oscillation frequency $f_0$ is varied according to the equation (1).

For example, in the case where the DC voltage $V_{band}$ is switched from 0(V) to a certain positive value, the capacitance $D_1$ of the variable capacitance diode $D_1$ is switched to a lower value, thereby the composite capacitance C' is switched to a lower value and thus the oscillation frequency $f_0$ is switched to a higher frequency in the higher oscillation frequency band, according to the equation (1).

As shown above, in the voltage controlled oscillator circuit of this embodiment, by providing the variable capacitance diode $D_2$ and the variable capacitance diode $D_1$ in parallel, and varying the two control voltages $V_{cont}$ and $V_{band}$ independently, further enlargement of the variable range of the oscillation frequency is made possible. Further, digitally switching the oscillation frequency between oscillation frequency bands is realized by the switching of the DC voltage $V_{band}$ which is independent of the control voltage $V_{cont}$ for varying the capacitance $D_2$ of the variable capacitance diode $D_2$.

Figure 4:
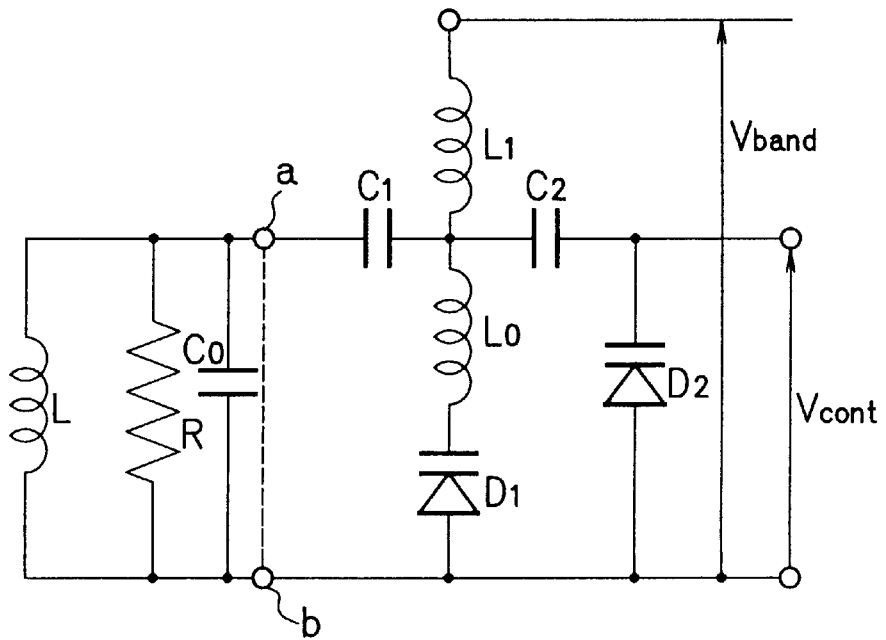
FIG. 4 is a circuit diagram showing a voltage controlled oscillator circuit according to the second embodiment of the present invention.

FIG. 4 is a circuit diagram showing a voltage controlled oscillator circuit according to the second embodiment of the present invention. In FIG. 4, the same reference characters as those of FIG. 3 designate the same or corresponding parts to those of FIG. 3 and thus repeated description thereof is omitted for brevity.

The voltage controlled oscillator circuit of FIG. 4 is almost the same as the voltage controlled oscillator circuit of FIG. 3, except that the variable capacitance diode $D_1$ of the circuit of FIG. 3 is replaced with a capacitance section which is composed of the variable capacitance diode $D_1$ and an inductor $L_0$. The inductor $L_0$ is added to the variable capacitance diode $D_1$ for adjusting the oscillation frequency to a desired value.

In the following, the operation of the voltage controlled oscillator circuit of the second embodiment will be described referring to FIG. 4. The operation of the circuit of FIG. 4 is almost the same as that of FIG. 3, and thus repeated description of the operation common to both circuit is omitted for brevity.

The oscillation frequency $f_0$ of the voltage controlled oscillator circuit is decided by the inductance L of the inductor L which is shown on the left-hand side of the broken line a-b and the composite capacitance C' of the circuit on the right-hand side of the negative resistance section $-R$, and the oscillation frequency $f_0$ is approximately expressed by the aforementioned equation (1), in the case where the reactance of the circuit on the right-hand side of the negative resistance section $-R$ is capacitive. Here, for a certain variable range of the DC voltage $V_{band}$, the variable range of the capacitance $D_1$ of the variable capacitance diode $D_1$ is widened due to the inductor $L_0$ connected in series, thereby the variable range of the oscillation frequency is further enlarged in the voltage controlled oscillator circuit of FIG. 4.

As shown above, in the voltage controlled oscillator circuit of the second embodiment, by providing the inductor $L_0$ in series with the variable capacitance diode $D_1$ of the circuit of FIG. 3, the oscillation frequency of the voltage controlled oscillator circuit can be adjusted to a desired value, and the variable range of the oscillation frequency with respect to a certain variable range of the DC voltage $V_{band}$ is made larger in comparison with the voltage controlled oscillator circuit of FIG. 3. Incidentally, although the inductor $L_0$ is provided in series with the variable capacitance diode $D_1$ in this embodiment, it is as well possible to provide an inductor in series with the variable capacitance diode $D_2$ and obtain similar effects.

Figure 5:
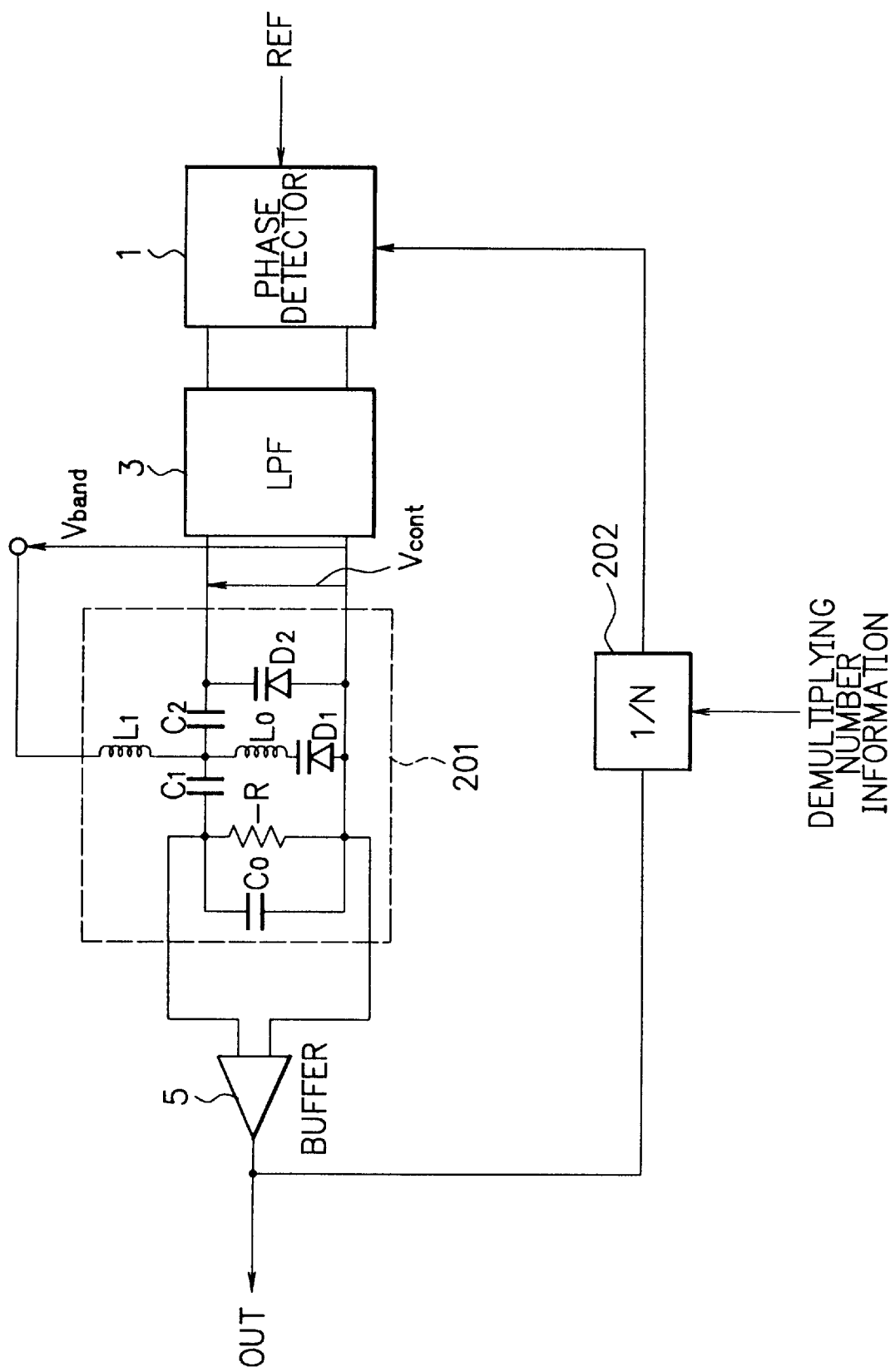
FIG. 5 is a circuit diagram of a phase locked loop in which the voltage controlled oscillator circuit of FIG. 4 is installed.

FIG. 5 is a circuit diagram of a phase locked loop in which the voltage controlled oscillator circuit of FIG. 4 is installed.

The phase locked loop of FIG. 5 comprises a phase detector 1 for detecting a phase difference between two input signals, a low pass filter 3 for cutting off high frequency signals, a voltage controlled oscillator circuit 201 according to the second embodiment of the present invention, a buffer 5 for receiving the oscillation output of the voltage controlled oscillator circuit 201 with high impedance and outputting an oscillation output signal OUT, and a 1/N frequency demultiplier 202 for demultiplying the frequency of the oscillation output signal OUT supplied from the buffer 5 by N (N: a natural number which is set according to demultiplying number information supplied to the 1/N frequency demultiplier 202). while supplying the phase detector 1 with the frequency demultiplied signal.

In the following, the operation of the phase locked loop of FIG. 5 will be described.

The phase detector 1 is supplied with a reference clock signal REF and the frequency demultiplied signal outputted by the 1/N frequency demultiplier 202. The reference clock signal REF has a predetermined fixed frequency $f_{REF}$. The phase detector 1 which is provided with a charge pump detects frequencies of both input signals and charges/discharges an electric charge stored in the low pass filter 3, according to the phase difference between the frequency demultiplied signal and the reference clock signal REF. The low pass filter 3 whose electric charge is charged/discharged by the phase detector 1 cuts off high frequency signal components and outputs the control voltage $V_{cont}$ to the variable capacitance diode $D_2$ in the voltage controlled oscillator circuit 201, according to the amount of the electric charge stored therein.

The capacitance of the variable capacitance diode $D_2$ to which the control voltage $V_{cont}$ is applied becomes smaller as the control voltage $V_{cont}$ becomes higher. And the oscillation frequency $f_0$ of the voltage controlled oscillator circuit 201 becomes higher as the capacitance of the variable capacitance diode $D_2$ becomes smaller. Therefore, the oscillation frequency $f_0$ becomes higher as the control voltage $V_{cont}$ becomes higher, and becomes lower as the control voltage $V_{cont}$ becomes lower. Here, in the case where the oscillation frequency $f_0$ becomes $f_{REF} \times N$ when the control voltage $V_{cont}$ becomes $V_{REF}$, the difference between the control voltage $V_{cont}$ and the $V_{REF}$ gets larger if the phase difference between the reference clock signal REF and the frequency demultiplied signal gets larger, therefore, the frequency of the frequency demultiplied signal which is outputted by the 1/N frequency demultiplier 202 gets closer to the frequency $f_{REF}$ of the reference clock signal REF as time passes. In the stationary state where the phase locked loop is phase locked, the oscillation frequency $f_0$ of the voltage controlled oscillator circuit 201 becomes N times the frequency of the reference clock signal REF (i.e. $f_{REF} \times N$).

In order to switch the oscillation frequency band of the voltage controlled oscillator circuit 201 and switch the frequency band of the oscillation output signal OUT, the demultiplying number information supplied to the 1/N frequency demultiplier 202 is changed and the N is switched to a larger number N', and the DC voltage $V_{band}$ is varied, for example, from 0(V) to a predetermined positive voltage. By the application of the DC voltage $V_{band}$, the capacitance $D_1$ of the variable capacitance diode $D_1$ is switched to a lower value, thereby the composite capacitance C' is switched to a lower value and thus the oscillation frequency $f_0$ is switched to a higher frequency in the higher oscillation frequency band, according to the aforementioned equation (1). By the operation, the oscillation frequency of the voltage controlled oscillator circuit 201 is switched to a higher frequency which is equal to $f_{REF} \times N'$, and the phase locked loop of FIG. 5 is phase locked in a new stationary state with its oscillation output signal OUT having the same higher frequency $f_{REF} \times N'$ in the higher frequency band.

The phase locked loop of FIG. 5 is utilized, for example, in detectors of portable telephones for detection of radio wave frequency. In the following, a case where the phase locked loop of FIG. 5 is applied to a dual band portable telephone will be described.

In order to design a portable telephone as a dual band portable telephone to operate in two radio wave frequency bands of, for example, 900MHz band and 1.8GHz band, the frequency $f_{REF}$ of the reference clock signal REF of the dual band portable telephone can be set at 200KHz.

For use in the 900MHz band, the demultiplying number N of the 1/N frequency demultiplier 202 is set at a selected value N1 around 4500, and the DC voltage $V_{band}$ for switching oscillation frequency band is set at 0(V) for example. In the stationary state where the phase locked loop is phase locked, the control voltage $V_{cont}$ which is supplied from the low pass filter 3 to the variable capacitance diode $D_2$ is stabilized at 1.5(V) for example, and the oscillation frequency of the voltage controlled oscillator circuit 201 is stabilized at N1×200(kHz). For another frequency in the 900MHz band, the demultiplying number information supplied to the 1/N frequency demultiplier 202 is updated and the demultiplying number N is changed to a new selected value N2 around 4500, and the phase locked loop will be in a new stationary state with the control voltage $V_{cont}$ of 1.6(V) for example, and the oscillation frequency of the voltage controlled oscillator circuit 201 of N2×200 (kHz).

In order to switch the frequency band of the phase locked loop into the 1.8GHz band, the demultiplying number information supplied to the 1/N frequency demultiplier 202 is updated and the demultiplying number N is changed to a new selected value N3 around 9000, and the DC voltage $V_{band}$ for switching oscillation frequency band is set at a positive value 3.0(V) for example. By the application of the DC voltage $V_{band}$, the capacitance $D_1$ of the variable capacitance diode $D_1$ is switched to a lower value, thereby the composite capacitance C' is switched to a lower value and thus the oscillation frequency $f_0$ of the voltage controlled oscillator circuit 201 is switched to a higher frequency in the higher frequency band, according to the equation (1). Then, the phase locked loop will be in a new stationary state with the control voltage $V_{cont}$ of 1.5(V) for example, and the oscillation frequency of the voltage controlled oscillator circuit 201 of N3×200(kHz). For another frequency in the 1.8GHz band, the demultiplying number information is updated and the demultiplying number N is changed to a new selected value N4 around 9000. Then, the phase locked loop will be in a new stationary state with the control voltage $V_{cont}$ of 1.55(V) for example, and the oscillation frequency of the voltage controlled oscillator circuit 201 of N4×200 (kHz).

In order to return the frequency band of the phase locked loop into the 900MHz band, the demultiplying number information is updated and the demultiplying number N is changed to a new selected value N5 around 4500, and the DC voltage $V_{band}$ for switching the oscillation frequency band is returned to 0(V). Then, the phase locked loop will be in a new stationary state with the control voltage $V_{cont}$ of 1.55(V) for example, and the oscillation frequency of the voltage controlled oscillator circuit 201 of N5×200(kHz).

As shown above, in the phase locked loop of FIG. 5, fine frequency control of the oscillation output signal OUT can be executed by varying the demultiplying number N, and further, the band to band switching of the frequency of the oscillation output signal OUT can be executed by switching the DC voltage $V_{band}$ and the demultiplying number N.

As set forth hereinabove, by the voltage controlled oscillator circuit according to the present invention, the variable range of the oscillation frequency can be remarkably enlarged, by providing two variable capacitance diodes connected in parallel in a voltage controlled oscillator circuit and controlling the capacitance thereof by two independent oscillation frequency control voltages.

Further, digitally switching the oscillation frequency between oscillation frequency bands is made possible, by using one oscillation frequency control voltage for fine control of the oscillation frequency and using the other oscillation frequency control voltage for the switching between oscillation frequency bands.

Incidentally, although the number of the variable capacitance diodes included in the voltage controlled oscillator circuit is two in the embodiments shown above, it is of course as well possible to compose a voltage controlled oscillator circuit according to the present invention which includes three or more variable capacitance diodes, and similar effects can be obtained by such voltage controlled oscillator circuits.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A voltage controlled oscillator, comprising:

a negative resistance generator;

a resonance circuit electrically connected in parallel with said negative resistance generator;

a first variable capacitance diode electrically connected in parallel with said resonance circuit, a first end of said first variable capacitance diode being electrically connected to a first node that is electrically connected to said resonance circuit through a first coupling condenser;

a second variable capacitance diode electrically connected in parallel with said first variable capacitance diode, a first end of said second variable capacitance diode being electrically connected to said first node through a second coupling condenser and not through said first coupling condenser; and a first inductor, a first control voltage applied across said first variable capacitance diode through said first inductor that is electrically connected to said first node, a second control voltage independent of said first control voltage that is applied across said second variable capacitance diode and wherein varying at least one of said first and second control voltages varies an oscillation frequency of the voltage controlled oscillator.

2. The oscillator of claim 1, further comprising a second inductor electrically connected between said first node and said first end of said first variable capacitance diode.

* * * * *